United States Patent
Bae et al.

(10) Patent No.: US 11,338,699 B2
(45) Date of Patent: May 24, 2022

(54) APPARATUS, METHOD, BATTERY PACK AND ELECTRICAL SYSTEM FOR DETERMINING ELECTRODE INFORMATION OF BATTERY

(71) Applicant: LG Chem, Ltd., Seoul (KR)

(72) Inventors: Yoon-Jung Bae, Daejeon (KR); Dae-Soo Kim, Daejeon (KR); Ji-Yeon Kim, Daejeon (KR); Dong-Kyu Kim, Daejeon (KR); Jae-Hyun Lee, Daejeon (KR)

(73) Assignee: LG Energy Solution, Ltd.

( * ) Notice: Subject to any disclaimer, the term of this patent is extended or adjusted under 35 U.S.C. 154(b) by 135 days.

(21) Appl. No.: 16/644,197

(22) PCT Filed: Apr. 10, 2019

(86) PCT No.: PCT/KR2019/004294
§ 371 (c)(1),
(2) Date: Mar. 4, 2020

(87) PCT Pub. No.: WO2019/199062
PCT Pub. Date: Oct. 17, 2019

(65) Prior Publication Data
US 2021/0046844 A1 Feb. 18, 2021

(30) Foreign Application Priority Data

Apr. 10, 2018 (KR) .................. 10-2018-0041692
Apr. 9, 2019 (KR) .................. 10-2019-0041600

(51) Int. Cl.
*B60L 58/12* (2019.01)
*G01R 31/396* (2019.01)
(Continued)

(52) U.S. Cl.
CPC ............. *B60L 58/12* (2019.02); *B60L 3/0046* (2013.01); *B60L 3/12* (2013.01); *G01R 31/3835* (2019.01);
(Continued)

(58) Field of Classification Search
CPC ........ G01R 31/69; G01R 31/54; G01R 27/20; H01R 13/7175; H01R 13/6683
See application file for complete search history.

(56) References Cited

U.S. PATENT DOCUMENTS 9,461,490 B2 10/2016 Ying
9,847,558 B1 * 12/2017 Wang .................. H01M 10/425
(Continued)

FOREIGN PATENT DOCUMENTS

CN 101981750 A 2/2011
CN 102369627 A 3/2012
(Continued)

OTHER PUBLICATIONS

International Search Report for Application No. PCT/KR2019/004294 dated Jul. 29, 2019, 2 pages.
(Continued)

*Primary Examiner* — Akm Zakaria
(74) *Attorney, Agent, or Firm* — Lerner, David, Littenberg, Krumholz & Mentlik, LLP

(57) ABSTRACT

An apparatus and method for determining electrode information of a battery including a positive electrode and a negative electrode, and a battery pack including the apparatus. The apparatus includes a sensing unit configured to measure a voltage and a current of the battery, and a processor. The processor generates a V-dQ/dV curve based on the voltage and the current of the battery. The V-dQ/dV curve indicates a relationship between V (the voltage of the battery) and dQ/dV (a ratio of an amount of change dQ of
(Continued)

the remaining capacity to an amount of change dV of the voltage of the battery). The processor detects a plurality of feature points from the V-dQ/dV curve. The processor determines information associated with each of the first electrode and the second electrode as the electrode information based on the plurality of feature points.

18 Claims, 8 Drawing Sheets

(51) Int. Cl.
*G01R 31/3835* (2019.01)
*G01R 31/3842* (2019.01)
*B60L 3/00* (2019.01)
*B60L 3/12* (2006.01)

(52) U.S. Cl.
CPC ....... *G01R 31/3842* (2019.01); *G01R 31/396* (2019.01)

(56) References Cited

U.S. PATENT DOCUMENTS

| | | | | |
|---|---|---|---|---|
| 10,353,009 | B2* | 7/2019 | Torai | G01R 31/396 |
| 2011/0012604 | A1* | 1/2011 | Tsujiko | H01M 4/587 |
| | | | | 324/427 |
| 2012/0169288 | A1 | 7/2012 | Ueki et al. | |
| 2012/0226455 | A1 | 9/2012 | Kumashiro et al. | |
| 2013/0119940 | A1 | 5/2013 | Iriyama et al. | |
| 2013/0314050 | A1* | 11/2013 | Matsubara | H02J 7/00 |
| | | | | 320/134 |
| 2013/0335009 | A1* | 12/2013 | Katsumata | G01R 21/06 |
| | | | | 320/107 |
| 2015/0028815 | A1 | 1/2015 | Osawa et al. | |
| 2016/0061908 | A1* | 3/2016 | Torai | G01R 31/3842 |
| | | | | 702/63 |
| 2016/0181833 | A1 | 6/2016 | Araki et al. | |
| 2016/0195589 | A1 | 7/2016 | Hanyu et al. | |
| 2016/0204639 | A1* | 7/2016 | Hon | H01M 10/425 |
| | | | | 429/50 |
| 2017/0018797 | A1 | 1/2017 | Murashi et al. | |
| 2017/0234930 | A1 | 8/2017 | Lee et al. | |
| 2018/0205049 | A1 | 7/2018 | Min et al. | |
| 2018/0212458 | A1 | 7/2018 | Kawai et al. | |

FOREIGN PATENT DOCUMENTS

| | | |
|---|---|---|
| CN | 102655245 A | 9/2012 |
| CN | 103053066 A | 4/2013 |
| CN | 103513183 A | 1/2014 |
| CN | 104160291 A | 11/2014 |
| CN | 107112579 A | 8/2017 |
| JP | 2012054220 A | 3/2012 |
| JP | 2014007025 A | 1/2014 |
| JP | 6038275 B2 | 12/2016 |
| KR | 20110000558 A | 1/2011 |
| KR | 101611116 B1 | 4/2016 |
| KR | 20170023455 A | 3/2017 |
| KR | 20170023583 A | 3/2017 |
| KR | 20170073314 A | 6/2017 |
| WO | 2014128902 A1 | 8/2014 |
| WO | 2015025402 A1 | 2/2015 |
| WO | 2017013718 A1 | 1/2017 |
| WO | 2017057283 A1 | 4/2017 |

OTHER PUBLICATIONS

Extended European Search Report including Written Opinion for Application No. EP19784800.5 dated Dec. 7, 2020, 7 pgs.

Search Report from Chinese Application No. 201980004815.8 dated Sep. 8, 2021. 3 pgs.

* cited by examiner

APPARATUS, METHOD, BATTERY PACK AND ELECTRICAL SYSTEM FOR DETERMINING ELECTRODE INFORMATION OF BATTERY

CROSS-REFERENCE TO RELATED APPLICATIONS

The present application is a national phase entry under 35 U.S.C. § 371 of International Application No. PCT/KR2019/004294 filed Apr. 10, 2019, published in Korean, which claims priority from Korean Patent Application 10-2018-0041692 filed Apr. 10, 2018, and Korean Patent Application 10-2019-0041600 filed Apr. 9, 2019, all of which are incorporated herein by reference.

TECHNICAL FIELD

The present disclosure relates to an apparatus and method for determining information associated with a positive electrode and a negative electrode included in a battery, a battery pack including the apparatus and an electrical system.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of free charging and discharging, a very low self-discharge rate and high energy density.

The battery performance gradually degrades while the battery is repeatedly charged and discharged. Accordingly, to determine the battery performance, it is necessary to measure the electrode potential of the battery. The three electrode system potential measurement method using reference electrode has been mainly used.

The reference electrode is used when making a potential measuring battery circuit to measure the potential of the positive electrode or the negative electrode included in the battery, and should satisfy the requirement that the reference electrode be non-polarizable to maintain a constant potential value at a constant temperature. Additionally, one reference electrode is needed per battery, which in turn, requires a lot of time in the battery manufacturing process.

SUMMARY

Technical Problem

The present disclosure is directed to providing an apparatus, a method, a battery pack and an electrical system for determining information associated with a positive electrode and a negative electrode of a battery (for example, the type of an active material, the potential of the positive electrode or the negative electrode corresponding to a specific remaining capacity, etc.) without using a reference electrode by analyzing a plurality of feature points on a V-dQ/dV curve of the battery generated based on the voltage and the current of the battery.

The objects of the present disclosure are not limited to those mentioned above, and other objects and advantages of the present disclosure may be understood by the following description and will be apparent from the embodiments of the present disclosure. Further, it will be readily understood that the objects and advantages of the present disclosure may be realized by the means set forth in the appended claims and their combination.

Technical Solution

An apparatus for determining electrode information of a battery including a first electrode and a second electrode according to an aspect of the present disclosure includes one or more sensors configured to measure a voltage of the battery and a current of the battery, and a processor operably coupled to the one or more sensors.

The processor is configured to determine a remaining capacity of the battery based on the current of the battery. The processor is configured to convert a Q-V curve indicating a relationship between the voltage of the battery and the remaining capacity of the battery into a V-dQ/dV curve indicating a relationship between the voltage of the battery and a ratio of an amount of change of the remaining capacity to an amount of change of the voltage of the battery. The processor is configured to detect a plurality of feature points from the V-dQ/dV curve. The processor is configured to classify each of the plurality of feature points as a first electrode feature point or a second electrode feature point. The processor is configured to determine a type of a first electrode active material and a type of a second electrode active material included in the battery based on a total number of the plurality of feature points classified as first electrode feature points and a total number of the plurality of feature points classified as second electrode feature points.

The processor may be configured to classify each feature point disposed in a voltage range equal to or more than a predetermined reference voltage as a first electrode feature point. The processor may be configured to classify each feature point disposed in a voltage range less than the reference voltage as a second electrode feature point.

The processor may be configured to obtain a first capacity-potential curve of a reference battery from a memory unit operably coupled to the processor. The processor may be configured to, for each first electrode feature point, determine a first electrode potential of the reference battery corresponding to a remaining capacity of the first electrode feature point based on the first capacity-potential curve. The processor may be configured to determine a potential of the second electrode of the battery corresponding to the remaining capacity of the first electrode feature point based on a voltage of the first electrode feature point and the first electrode potential of the reference battery. The reference battery may include the first electrode active material and the second electrode active material.

The processor may be configured to determine the potential of the second electrode of the battery by subtracting the voltage of the first electrode feature point from the first electrode potential of the reference battery.

The processor may be configured to obtain a second capacity-potential curve of the reference battery from the memory unit. The processor may be configured to, for each second electrode feature point, determine a second electrode potential of the reference battery corresponding to a remaining capacity of the second electrode feature point from the second capacity-potential curve. The processor may be configured to determine a potential of the first electrode of the battery corresponding to the remaining capacity of the second electrode feature point based on a voltage of the second electrode feature point and the second electrode potential of the reference battery.

The processor may be configured to determine the potential of the first electrode of the battery by adding the voltage of the second electrode feature point to the second electrode potential of the reference battery.

The processor may be configured to determine whether the potential of the first electrode of the battery is valid based on a result of comparing the potential of the first electrode of the battery with a valid range.

The processor may be configured to output a message indicating that the first electrode is in faulty state when the potential of the first electrode of the battery is outside of the valid range.

A battery pack according to another aspect of the present disclosure may include the apparatus of any of the embodiments described herein.

An electrical system according to still another aspect of the present disclosure may include the battery pack of any of the embodiments described herein.

A method according to another aspect of the present disclosure is for determining the electrode information of a battery. The method includes measuring each of a voltage and a current of the battery, determining a remaining capacity of the battery based on the measured current of the battery, generating a Q-V curve indicating a relationship between the voltage of the battery and the remaining capacity of the battery, converting the Q-V curve into a V-dQ/dV curve indicating a relationship between the voltage of the battery and a ratio of an amount of change of the remaining capacity to an amount of change of the voltage of the battery, detecting the plurality of feature points from the V-dQ/dV curve, classifying each of the plurality of feature points as a first electrode feature point or as a second electrode feature point, and determining a type of a first electrode active material and a type of a second electrode active material included in the battery based on a total number of the plurality of feature points classified as first electrode feature points and a total number of the plurality of feature points classified as second electrode feature points.

The method may further include obtaining a first capacity-potential curve and a second capacity-potential curve for a reference battery based on the type of the first electrode active material and the type of the second electrode active material, for each first electrode feature point, determining a first electrode potential of the reference battery corresponding to the remaining capacity of the first electrode feature point from the first capacity-potential curve, and determining a potential of the second electrode of the battery corresponding to the remaining capacity of the first electrode feature point based on a voltage of the first electrode feature point and the first electrode potential of the reference battery.

The method may further include determining the potential of the second electrode of the battery by subtracting the voltage of the first electrode feature point from the first electrode potential of the reference battery.

The method may further include obtaining a second capacity-potential curve of the reference battery from the memory unit and, for each second electrode feature point, determining a second electrode potential of the reference battery corresponding to a remaining capacity of the second electrode feature point from the second capacity-potential curve, and determining a potential of the first electrode of the battery corresponding to the remaining capacity of the second electrode feature point based on a voltage of the second electrode feature point and the second electrode potential of the reference battery.

The method may further include determining the potential of the first electrode of the battery by adding the voltage of the second electrode feature point to the second electrode potential of the reference battery.

The method may further include determining whether the potential of the first electrode of the battery is valid based on a result of comparing the potential of the first electrode of the battery with a first valid range.

The method may further include outputting a message indicating that at least one of the first electrode or the second electrode of the battery is in faulty state when the potential of the first electrode of the battery is outside of the first valid range or when the potential of the second electrode of the battery is outside of a second valid range.

The method may further include classifying each feature point disposed in a voltage range equal to or more than a predetermined reference voltage as a first electrode feature point, and classifying each feature point disposed in a voltage range equal to or more than a predetermined reference voltage as a first electrode feature point.

Advantageous Effects

According to the present disclosure, it is possible to determine information associated with a positive electrode and a negative electrode of a battery without using a reference electrode, through analysis of a plurality of feature points on a V-dQ/dV curve of the battery generated based on the voltage and the current of the battery.

The effects of the present disclosure are not limited to the effects mentioned above, and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
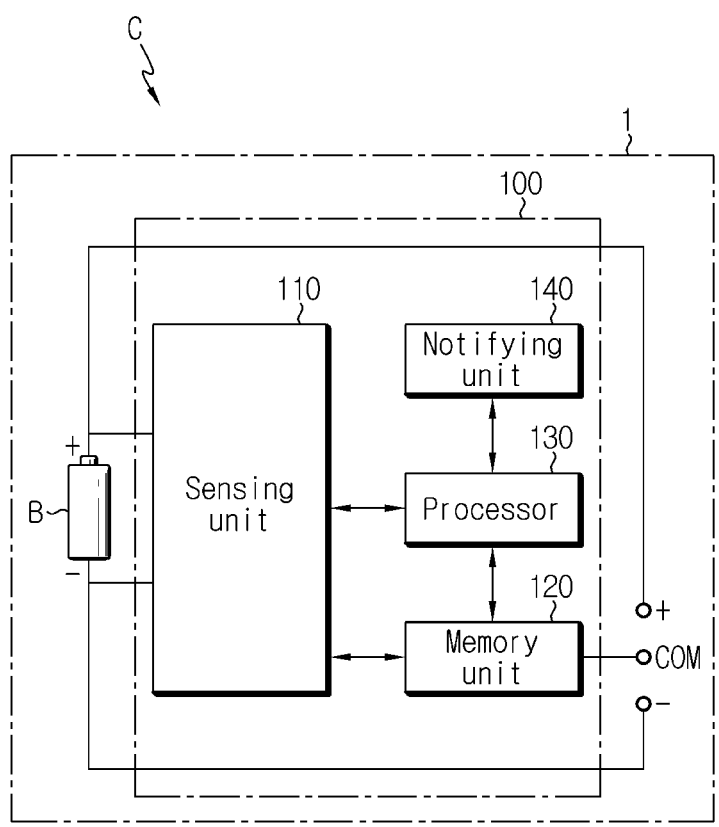
FIG. 1 is a diagram showing a configuration of an apparatus for determining electrode information of a battery according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 2:
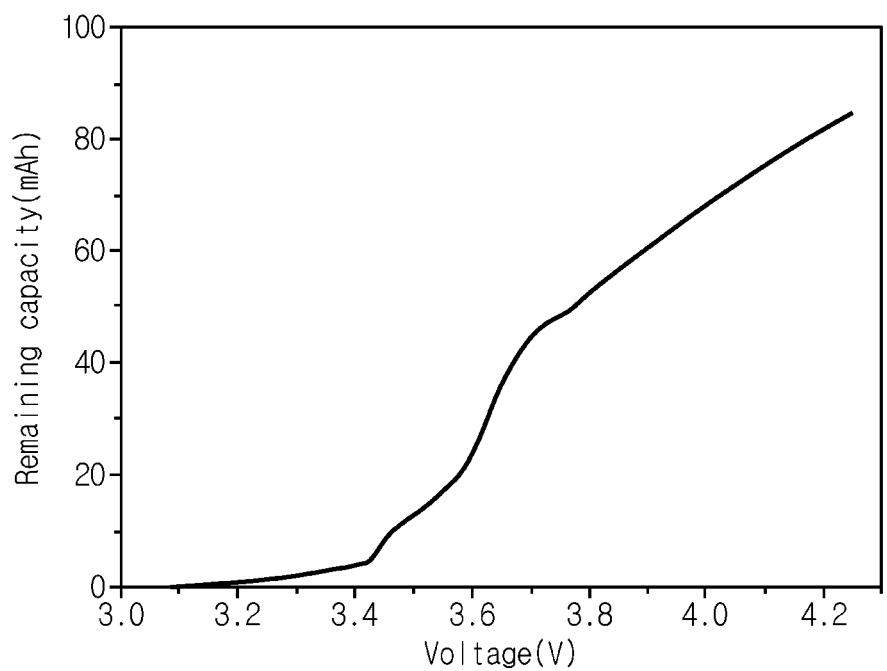
FIG. 2 is an exemplary graph showing a Q-V curve indicating a relationship between voltage and remaining capacity of a battery.
Figure 3:
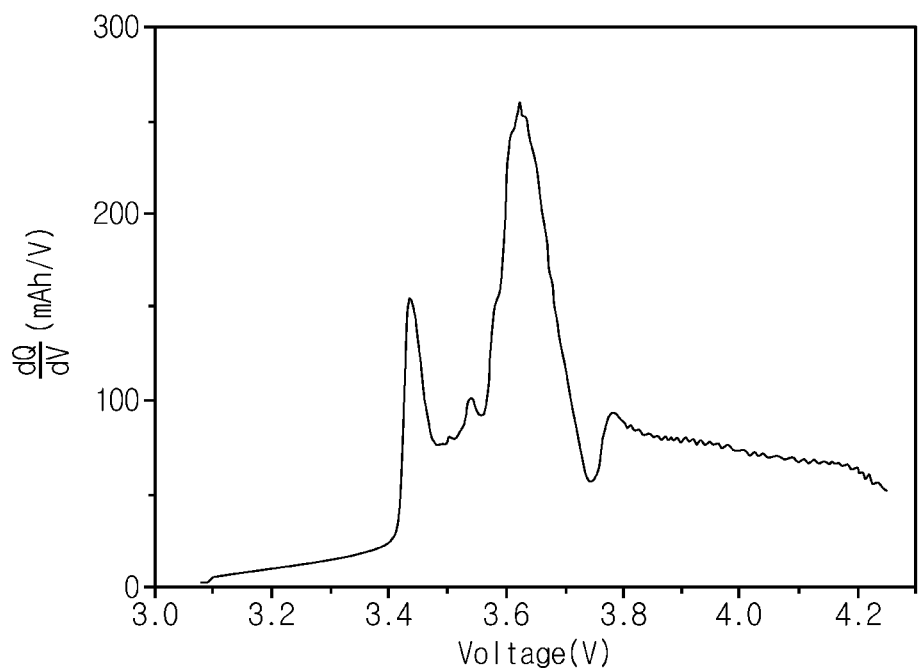
FIG. 3 is an exemplary graph showing a V-dQ/dV curve obtained from the Q-V curve of FIG. 2.
Figure 4:
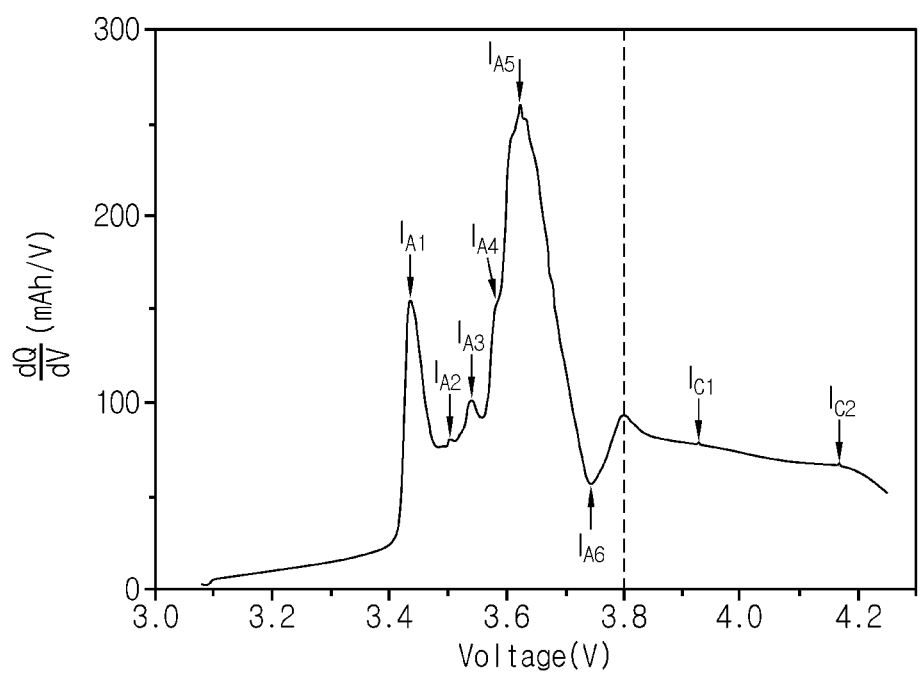
FIG. 4 is an exemplary graph showing the smoothed V-dQ/dV curve of FIG. 3.
Figure 5:
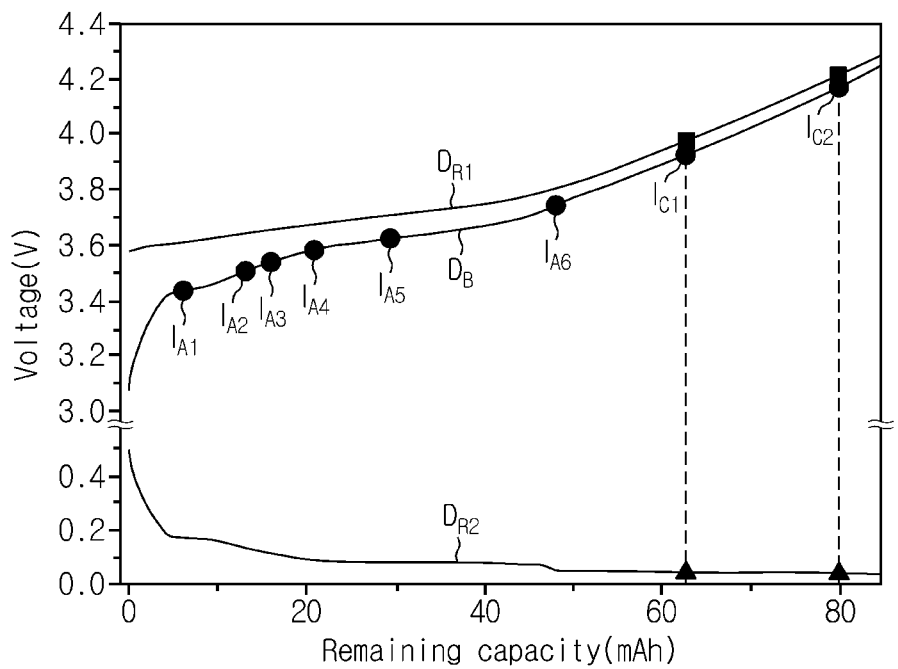
FIGS. 5 and 6 are graphs for reference in describing a relationship between a Q-V curve of a battery and a first capacity-potential curve and a second capacity-potential curve of a specific reference battery.
Figure 6:
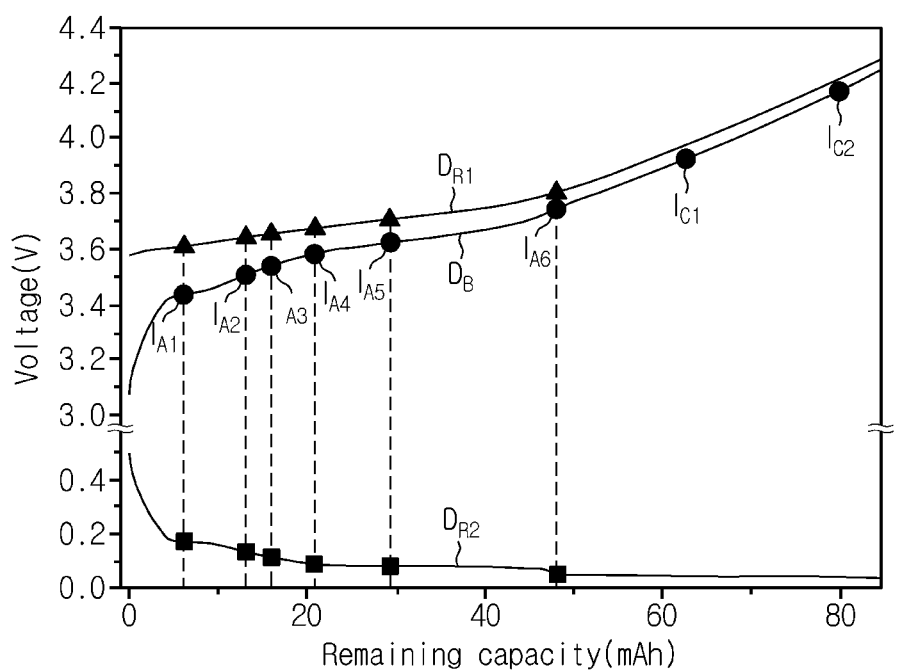

FIG. 1 is a diagram showing a configuration of an apparatus for determining electrode information of a battery according to an embodiment of the present disclosure, FIG. 2 is an exemplary graph showing a Q-V curve indicating a relationship between voltage and remaining capacity of the battery, FIG. 3 is an exemplary graph showing a V-dQ/dV curve obtained from the Q-V curve of FIG. 2, FIG. 4 is an exemplary graph showing the smoothed V-dQ/dV curve of FIG. 3, and FIGS. 5 and 6 are graphs for reference in describing a relationship between the Q-V curve of the battery and a first capacity-potential curve and a second capacity-potential curve of a specific reference battery.

First, referring to FIG. 1, an electrical system C may include a battery pack 1. The apparatus 100 may be included in the battery pack 1 including a battery B. The battery B includes a first electrode and a second electrode. The apparatus 100 may be electrically connectable to the battery B and may respectively estimate a first electrode potential and a second electrode potential of the battery B. The first electrode potential of the battery B may be a redox potential of the first electrode (for example, the positive electrode) of the battery B. The second electrode potential of the battery B may be a redox potential of the second electrode (for example, the negative electrode) of the battery B.

The apparatus 100 may be included in a battery management system (BMS) (not shown) provided in the battery pack 1.

The apparatus 100 may include a sensing unit 110, a memory unit 120 and a processor 130. The apparatus 100 may further include a notifying unit 140.

The battery B may include a plurality of unit cells electrically connected in series and/or in parallel. Of course, the battery B including only one unit cell falls within the scope of the present disclosure. The unit cell is not limited to a particular type, and includes any type that can be recharged repeatedly. For example, the unit cell may be a pouch type lithium polymer battery.

The battery B may be coupled or separated to/from the electrical system C through a positive (+) terminal, a negative (−) terminal and a communication terminal COM of the battery pack 1. The electrical system C may be, for example, an electric vehicle, a hybrid electric vehicle, an unmanned flying object such as a drone, an energy storage system (ESS) that is electrically connectable to an electrical grid, a charger or a mobile device.

The sensing unit 110 is operably coupled to the processor 130. That is, the sensing unit 110 may be configured to transmit an electrical signal to the processor 130 or receive an electrical signal from the processor 130.

The sensing unit 110 may include a current sensor configured to measure the current of the battery B and a voltage sensor configured to measure the voltage of the battery B. The sensing unit 110 may measure the voltage applied between a positive terminal and a negative terminal of the battery B and the current flowing in or out of the battery B repeatedly in a predetermined cycle, and output a measurement signal indicating the measured voltage and the measured current to the processor 130.

The processor 130 may convert the measurement signal received from the sensing unit 110 into a digital value indicating each of the voltage and the current of the battery B through signal processing, and store the digital value in the memory unit 120.

The memory unit 120 is a semiconductor memory device, and records, erases and updates data generated by the processor 130 and stores a plurality of program codes provided to estimate at least one of the first electrode potential and the second electrode potential of the battery B. Additionally, the memory unit 120 may store predetermined parameter values used when practicing the present disclosure.

The memory unit 120 is not limited to a particular type, and includes any semiconductor memory device known for being capable of recording, erasing and updating data. For example, the memory unit 120 may be dynamic random-access memory (DRAM), synchronous dynamic-random access memory (SDRAM), a flash memory, read-only memory (ROM), electrically erasable programmable read-only memory (EEPROM), and register. The memory unit 120 may further include a storage medium that stores program codes defining control logic of the processor 130. The storage medium includes an inactive memory device such as flash memory or hard disk. The memory unit 120 is operably coupled to the processor 130. The memory unit 120 may be physically separated from the processor 130, and the memory unit 120 and the processor 130 may be integrated into one.

The processor 130 may control the current of the battery B so that the battery B is charged or discharged with the current (i.e., constant current) of a preset current value. The processor 130 may estimate the remaining capacity of the battery B in a predetermined cycle by integrating the current of the battery B over time. The remaining capacity of the battery B may refer to quantity of electric charge stored in the battery B.

In this instance, the preset current value (i.e., the magnitude of the constant current) may be calculated by the processor 130 using the following Equation 1.

$$I_c = a \times C_n \quad \text{<Equation 1>}$$

Here, $I_c$ may be the magnitude of the constant current, a may be a constant of 1 or less (for example, 0.6), and $C_n$ may be the magnitude of the rated current of the battery B.

The processor 130 may estimate the remaining capacity of the battery B in the predetermined cycle based on a period of time during which the battery B is charged or discharged with the current of the preset current value. For example, the processor 130 may calculate the remaining capacity of the battery B repeatedly in the predetermined cycle using the current integration method. Of course, the method of calculating the remaining capacity of the battery B is not limited to the current integration method.

The processor 130 may generate a voltage-remaining capacity curve of the battery B based on a result of mapping the remaining capacity of the battery B and the voltage of the battery B which are obtained in the predetermined cycle.

Here, the voltage of the battery B may be an open circuit voltage (OCV) of the battery B.

As shown in FIG. 2, the voltage-remaining capacity curve (hereinafter referred to as a 'V-Q curve' or 'Q-V curve') of the battery B may be represented in the form that defines a relationship between the remaining capacity Q and the voltage V of the battery B.

The V-Q curve may be stored in the memory unit 120 in the form of a function that approximates the remaining capacity of the battery B as a function of the voltage of the battery B with a curve. Alternatively, the V-Q curve may be stored in the memory unit 120 in the form of a lookup table.

The processor 130 converts the V-Q curve (or a function corresponding to the V-Q curve) of the battery B into a V-dQ/dV curve. The dQ/dV is a ratio of an amount of change dQ of the remaining capacity of the battery B to an amount of change dV of the voltage of the battery B. That is, the processor 130 may generate V-dQ/dV shown in FIG. 3 by differentiating the V-Q curve (or a function corresponding to the V-Q curve) with respect to the voltage V of the battery B. The V-dQ/dV is a curve indicating a relationship between voltage V and dQ/dV of the battery B.

Subsequently, the processor 130 may detect a plurality of feature points (for example, a local maximum point, a local minimum point, and an inflection point) on the V-dQ/dV curve. Each feature point detected from the V-dQ/dV curve may respectively correspond to a specific order among all feature points appearing in the V-dQ/dV curve. For example, when the processor 130 is set to detect three feature points from the V-dQ/dV curve, the three feature points may be an $1^{th}$ local maximum point, an $m^{th}$ local maximum point and an $n^{th}$ local minimum point on the V-dQ/dV curve in descending order of the remaining capacity of each of the three feature points.

Before detecting the plurality of feature points on the V-dQ/dV curve, the processor 130 may remove a noise component from the V-dQ/dV curve of FIG. 3 by using a noise filter. As a result, the V-dQ/dV curve of FIG. 3 may be smoothed as shown in FIG. 4. Through this, it is possible to prevent a phenomenon in which a feature point is incorrectly detected from the V-dQ/dV curve of FIG. 3 due to the noise component present in the V-dQ/dV of FIG. 3, thereby improving accuracy in the feature point detection. Of course, smoothing of the V-dQ/dV curve of FIG. 3 is an optional process, and instead of the V-dQ/dV curve of FIG. 4, the processor 130 may detect the plurality of feature points from the V-dQ/dV curve of FIG. 3. Hereinafter, for convenience of description, it is assumed that the plurality of feature points is detected from the V-dQ/dV curve of FIG. 4. In detail, the processor 130 may detect each point on the V-dQ/dV curve where the second-order differential coefficient of the V-Q curve (or a function corresponding to the V-Q curve) of the battery B is 0 as the feature point of the V-dQ/dV curve.

In an example, the processor 130 may detect each point on the V-dQ/dV curve where the ratio of the amount of change dQ of the remaining capacity of the battery B to the amount of change dV of the voltage of the battery B increases and then decreases as the feature point (local maximum point).

In another example, the processor 130 may detect each point on the V-dQ/dV curve where the ratio of the amount of change dQ of the remaining capacity of the battery B to the amount of change dV of the voltage of the battery B decreases and then increases as the feature point (local minimum point).

Each feature point may be indicated as a pair of the voltage V of the battery B and the remaining capacity Q (or dQ/dV) at that voltage V.

FIG. 4 shows an example of eight feature points $I_{A1}$, $I_{A2}$, $I_{A3}$, $I_{A4}$, $I_{A5}$, $I_{A6}$, $I_{C1}$, $I_{C2}$ disposed on the V-dQ/dV curve, detected by the processor 130.

The processor 130 may classify each of the feature points $I_{A1}$, $I_{A2}$, $I_{A3}$, $I_4$, $I_{A5}$, $I_{A6}$, $I_{C1}$, $I_{C2}$ as any one of a first electrode feature point and a second electrode feature point based on a result of comparison between the voltage of each feature point and a predetermined reference voltage.

In detail, when the voltage of a specific feature point among the feature points $I_{A1}$, $I_{A2}$, $I_{A3}$, $I_{A4}$, $I_{A5}$, $I_{A6}$, $I_{C1}$, $I_{C2}$ is equal to or more than the predetermined reference voltage, the processor 130 may classify the specific feature point as the first electrode feature point. On the contrary, when the voltage of the specific feature point is less than the predetermined reference voltage, the processor 130 may classify the specific feature point as the second electrode feature point instead of the first electrode feature point.

The first electrode feature point may be a feature point detected by the electrochemical properties of an active material (hereinafter referred to as a 'first electrode active material') used to manufacture the first electrode of the battery B. While the battery B degrades, the first electrode potential of the battery B at the remaining capacity of each first electrode feature point may be constant.

The second electrode feature point may be a feature point detected by the electrochemical properties of an active material (hereinafter referred to as a 'second electrode active material') used to manufacture the second electrode of the battery B. While the battery B degrades, the second electrode potential of the battery B at the remaining capacity of each second electrode feature point may be constant.

Assume that the predetermined reference voltage is 3.8 Volt. Among the feature points $I_{A1}$, $I_{A2}$, $I_{A3}$, $I_{A4}$, $I_{A5}$, $I_{A6}$, $I_{C1}$, $I_{C2}$, the processor 130 may classify the feature points $I_{C1}$, $I_{C2}$ disposed in the voltage range equal to or more than the predetermined reference voltage as the first electrode feature point. Among the feature points $I_{A1}$, $I_{A2}$, $I_{A3}$, $I_{A4}$, $I_{A5}$, $I_{A6}$, $I_{C1}$, $I_{C2}$ the processor 130 may classify the feature points $I_{A1}$, $I_{A2}$, $I_{A3}$, $I_{A4}$, $I_{A5}$, $I_{A6}$ disposed in the voltage range less than the predetermined reference voltage as the second electrode feature point.

The processor 130 may determine the type of the first electrode active material and the type of the second electrode active material included in the battery B based on the feature points $I_{A1}$, $I_{A2}$, $I_{A3}$, $I_{A4}$, $I_{A5}$, $I_{A6}$, $I_{C1}$, $I_{C2}$. In detail, the processor 130 may determine the type of the first electrode active material and the type of the second electrode active material of the battery B based on the number of the first electrode feature points and the number of the second electrode feature points.

To this end, the memory unit 120 may pre-store a lookup table (referred to as an 'active material list table') in which the number of the first electrode feature points, the number of the second electrode feature points, the type of the first electrode active material and the type of the second electrode active material are mapped.

As in the above example, when the number of the first electrode feature points is 2 and the number of the second electrode feature points is 6, the processor 130 may obtain "$LiMO_2$" and "$SiO_2$" as the type of the first electrode active material and the type of the second electrode active material included in the battery B from the active material list table, using the number of the first electrode feature points and the number of the second electrode feature points as a first index and a second index respectively. Of course, when the number of the first electrode feature points is not 2 or the number of the second electrode feature points is not 6, instead of "$LiMO_2$", a different type of active material may be obtained as the first electrode active material of the battery B, or instead of "$SiO_2$", a different type of active material may be obtained as the second electrode active material of the battery B.

The memory unit 120 may pre-store at least one of a first capacity-potential curve and a second capacity-potential curve for each of a plurality of reference batteries in the form of a lookup table. Each reference battery is distinguished from the other reference battery based on the type of the positive electrode active material and the type of the negative electrode active material included therein. That is, each reference battery may include a different type of positive electrode active material from the positive electrode active material included in the other reference battery, or a different type of negative electrode active material from the negative electrode active material included in the other reference battery.

The processor 130 may obtain, from the memory unit 120, the first capacity-potential curve and the second capacity-potential curve for any one reference battery (hereinafter referred to as a 'specific reference battery') having the same type of first electrode active material and second electrode active material as the battery B among the plurality of reference batteries.

FIGS. 5 and 6 show the first capacity-potential curve DRi and the second capacity-potential curve $D_{R2}$ for the specific reference battery, together with the Q-V curve $D_B$ of the battery B. The Q-V curve $D_B$ may be shown with the horizontal axis and the vertical axis being the vertical axis and the horizontal axis of the V-Q curve shown in FIG. 2 respectively.

The first capacity-potential curve $D_{R1}$ for the specific reference battery indicates a relationship between the first electrode potential and the remaining capacity of the specific reference battery before degradation (for example, Beginning Of Life (BOL)). The first electrode potential of the specific reference battery may be a redox potential of the first electrode (for example, the positive electrode) of the specific reference battery.

The second capacity-potential curve $D_{B2}$ for the specific reference battery indicates a relationship between the second electrode potential and the remaining capacity of the specific reference battery before degradation. The second electrode potential of the specific reference battery may be a redox potential of the second electrode (for example, the negative electrode) of the specific reference battery.

The processor 130 may read the first electrode potential or the second electrode potential of the specific reference battery corresponding to the remaining capacity of each of the feature points $I_{A1}$, $I_{A2}$, $I_{A3}$, $I_{A4}$, $I_{A5}$, $I_{A6}$, $I_{C1}$, $I_{C2}$.

As shown in FIG. 5, the processor 130 may read the remaining capacity and the voltage of each of the first electrode feature points $I_{C1}$, $I_{C2}$ of FIG. 4 from the Q-V curve $D_B$.

Subsequently, the processor 130 may determine the second electrode potential of the battery B corresponding to each read remaining capacity by subtracting the voltage of the first electrode feature points $I_{C1}$, $I_{C2}$ corresponding to each read remaining capacity from the first electrode potential of the specific reference battery corresponding to each read remaining capacity. The processor 130 may calculate the second electrode potential of the battery B corresponding to the remaining capacity Q using the following Equation 2.

$$V_{R2}(Q)=V_{R1}(Q)-V_{B1}(Q) \qquad \text{<Equation 2>}$$

Here, $V_{R1}(Q)$ is the first electrode potential ('■' in FIG. 5) of the specific reference battery corresponding to the remaining capacity Q, $V_{B1}(Q)$ is the voltage ('574' in FIG. 5) of the first electrode feature point corresponding to the remaining capacity Q, and $V_{R2}(Q)$ is the second electrode potential ('▲' in FIG. 5) of the battery B corresponding to the remaining capacity Q.

The processor 130 may determine $V_{R2}(Q)$ as the negative electrode potential of the battery B corresponding to the remaining capacity Q, and $V_{R1}(Q)$ as the positive electrode potential of the battery B corresponding to the remaining capacity Q.

Meanwhile, as shown in FIG. 6, the processor 130 may read the remaining capacity and the voltage of each second electrode feature point $I_{A1}$, $I_{A2}$, $I_{A3}$, $I_{A4}$, $I_{A5}$, $I_{A6}$ among the feature points $I_{A1}$, $I_{A2}$, $I_{A3}$, $I_{A4}$, $I_{A5}$, $I_{A6}$, $I_{C1}$, $I_{C2}$ from the Q-V curve $D_B$ of the battery B.

The processor 130 may determine the first electrode potential of the battery B corresponding to each read remaining capacity by adding the second electrode potential of the specific reference battery corresponding to each read remaining capacity to the voltage of the second electrode feature points $I_{A1}$, $I_{A2}$, $I_{A3}$, $I_{A4}$, $I_{A5}$, $I_{A6}$ corresponding to each read remaining capacity. The processor 130 may calculate the first electrode potential of the battery B corresponding to the remaining capacity Q using the following Equation 3.

$$V_{Q1}(Q)=V_{Q2}(Q)+V_{B2}(Q) \qquad \text{<Equation 3>}$$

Here, $V_{Q2}(Q)$ is the second electrode potential ('■' in FIG. 6) of the specific reference battery corresponding to the remaining capacity Q, $V_{B2}(Q)$ is the voltage ('●' in FIG. 6) of the second electrode feature point corresponding to the remaining capacity Q, and $V_{Q1}(Q)$ is the first electrode potential ('▲' in FIG. 6) of the battery B corresponding to the remaining capacity Q.

The processor 130 may determine $V_{Q1}(Q)$ as the positive electrode potential of the battery B corresponding to the remaining capacity Q, and $V_{Q2}(Q)$ as the negative electrode potential of the battery B corresponding to the remaining capacity Q.

According to the description made with reference to FIGS. 5 and 6, it is possible to accurately estimate each of the positive electrode potential and the negative electrode potential of the battery B without using a reference electrode, by measuring the voltage and the current of the battery B.

Meanwhile, the processor 130 may compare the electrode potential (i.e., the first electrode potential or the second electrode potential) of the battery B with a valid range, and diagnose whether the electrode potential of the battery B is valid based on the comparison result.

When the electrode potential of the battery B is not positioned in the valid range, the processor 130 may determine that the electrode potential of the battery B is invalid. The invalid electrode potential of the battery B may indicate that at least one of the first electrode and the second electrode of the battery B degrades beyond a predetermined level, thus the battery B needs to be replaced with a new one.

The processor 130 may set the valid range by referring to the first capacity-potential curve $D_{R1}$ and the second capacity-potential curve $D_{R2}$ of the specific reference battery.

In detail, the processor 130 may read the first electrode potential of the specific reference battery corresponding to the remaining capacity of each second electrode feature point $I_{A1}$, $I_{A2}$, $I_{A3}$, $I_{A4}$, $I_{A5}$, $I_{A6}$ from the first capacity-potential curve $D_{R1}$. Subsequently, the processor 130 may set a first valid range (for example, 3.9~4.2 Volt) based on the read first electrode potential of the specific reference battery. The processor 130 may compare the first electrode potential of the battery B with the first valid range, and diagnose whether the first electrode potential of the battery B is valid. For example, when the first electrode potential of the battery B is outside of the first valid range, the first electrode of the battery B may be diagnosed as being in faulty state.

The processor 130 may read the second electrode potential of the specific reference battery corresponding to the remaining capacity of each first electrode feature point $I_{C1}$, $I_{C2}$ from the second capacity-potential curve $D_{R2}$. Subsequently, the processor 130 may set a second valid range (for example, 0.03~0.2 Volt) based on the second electrode potential of the specific reference battery. The processor 130 may compare the second electrode potential of the battery B with the second valid range, and diagnose whether the second electrode potential of the battery B is valid. For example, when the second electrode potential the battery B is outside of the second valid range, the second electrode of the battery B may be diagnosed as being in faulty state.

Alternatively, the first valid range and the second valid range may be preset.

The processor 130 may transmit a message indicating the electrode information of the battery B to the electrical system C through the communication terminal COM. The notifying unit 140 may be operably coupled to the processor 130. The notifying unit 140 may include at least one of a display unit to visually display the electrode information of the battery B (for example, symbol, figure, image) and a speaker device to audibly output the electrode information of the battery B, in response to the message received from the processor 130.

The processor 130 may selectively include an application-specific integrated circuit (ASIC), a chipset, a logic circuit, a register, a communication modem and a data processing device, known in the art to execute various control logics. At least one of the various control logics that can be executed by the processor 130 may be combined, and the combined control logics may be written in computer-readable coding systems and stored in computer-readable recording media. The recording media is not limited to a particular type and includes any type that can be accessed by the processor 130 included in the computer. For example, the recording media may include at least one selected from the group consisting of ROM, RAM, register, CD-ROM, magnetic tape, hard disk, floppy disk and an optical data recording device. Additionally, the coding system may be modulated to a carrier signal and included in a communication carrier at a specific point in time, and may be stored and executed in computers connected via a network in distributed manner Additionally, functional programs, codes and segments for implementing the combined control logics may be easily inferred by programmers in the technical field pertaining to the present disclosure.

Figure 7:
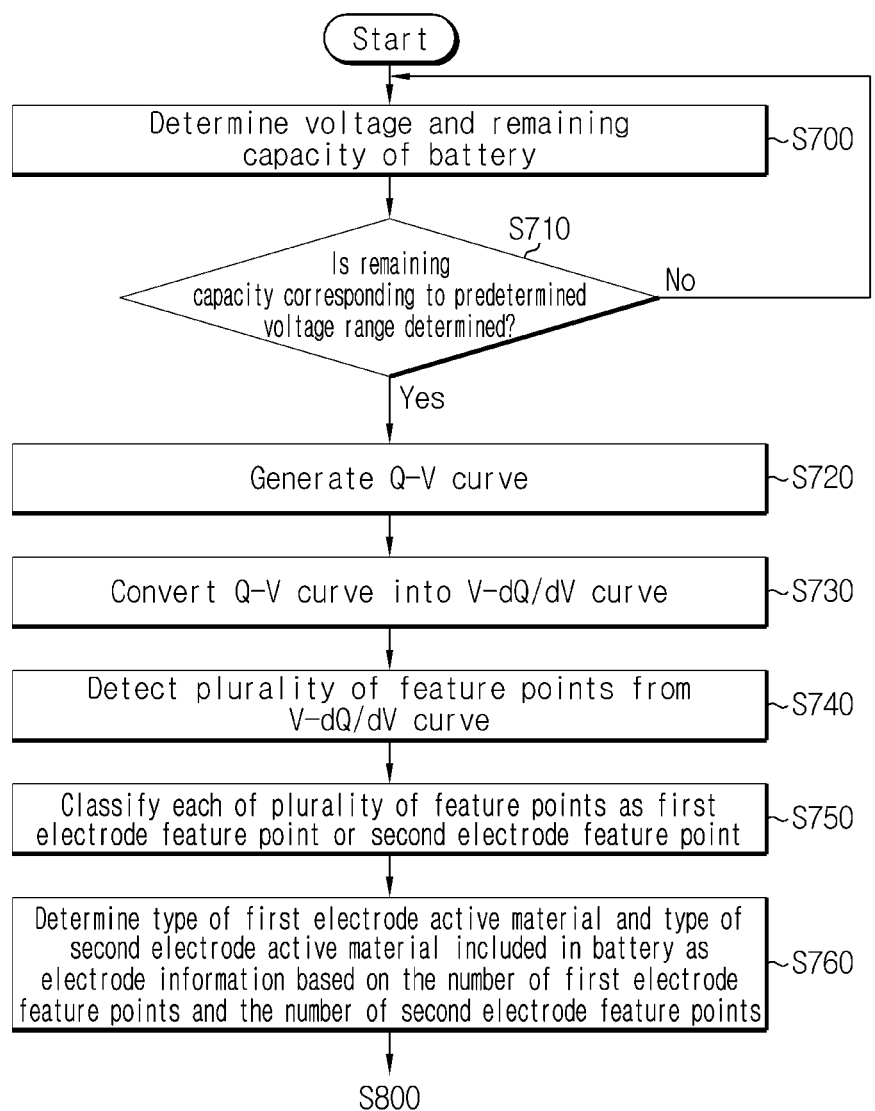
FIGS. 7 and 8 are flowcharts of a method for determining electrode information of a battery according to another embodiment of the present disclosure.
Figure 8:
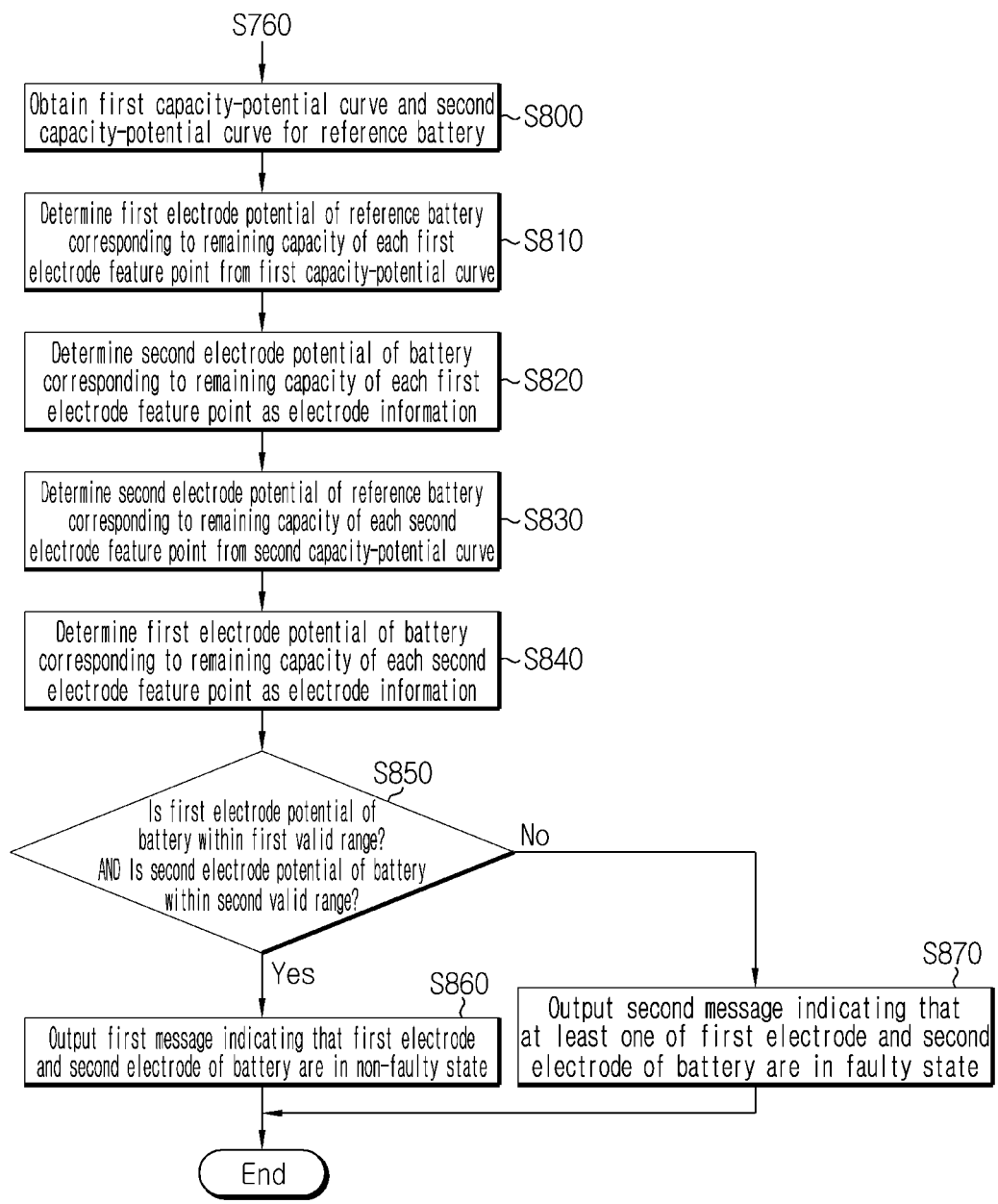

FIGS. 7 and 8 are flowcharts of a method for determining electrode information of a battery according to another embodiment of the present disclosure.

Referring to FIGS. 1 to 8, in step S700, the processor 130 determines voltage V and remaining capacity Q of the battery B based on the measurement signal from the sensing unit 110. Data indicating V and Q determined in the step S700 may be stored in the memory unit 120 in a predetermined cycle.

In step S710, the processor 130 determines whether the remaining capacity corresponding to a predetermined voltage range (for example, a final discharge voltage a final charge voltage) is determined. When a value of the step S710 is "Yes", step S720 may be performed. When the value of the step S710 is "No", the step S700 may be performed again.

In step S720, the processor 130 generates a Q-V curve (see FIG. 2, etc.) indicating a relationship between the voltage and the remaining capacity of the battery B.

In step S730, the processor 130 converts the Q-V curve for the battery B into a V-dQ/dV curve (see FIG. 4, etc.).

In step S740, the processor 130 detects a plurality of feature points from the V-dQ/dV curve.

In step S750, the processor 130 classifies each of the plurality of feature points as a first electrode feature point or a second electrode feature point.

In step S760, the processor 130 determines the type of the first electrode active material and the type of the second electrode active material included in the battery B as electrode information based on the number of the first electrode feature points and the number of the second electrode feature points. After the step S760, the method may end or move to step S800.

In step S800, the processor 130 obtains a first capacity-potential curve and a second capacity-potential curve for a reference battery from the memory unit 120. The reference battery is a battery that has the same types of the first electrode active material and the second electrode active material as the battery B.

In step S810, the processor 130 determines the first electrode potential of the reference battery corresponding to the remaining capacity of each first electrode feature point from the first capacity-potential curve.

In step S820, the processor 130 determines the second electrode potential of the battery B corresponding to the remaining capacity of each first electrode feature point as the electrode information based on the voltage of each first electrode feature point and the first electrode potential of the reference battery.

In step S830, the processor 130 determines the second electrode potential of the reference battery corresponding to the remaining capacity of each second electrode feature point from the second capacity-potential curve.

In step S840, the processor 130 determines the first electrode potential of the battery B corresponding to the remaining capacity of each second electrode feature point as the electrode information based on the voltage of each second electrode feature point and the second electrode potential of the reference battery.

In step S850, the processor 130 determines whether the first electrode potential of the battery B is within the first valid range and whether the second electrode potential of the battery B is within the second valid range. When a value of the step S850 is "Yes", step S860 may be performed. When the value of the step S850 is "No", step S870 may be performed.

In step S860, the processor 130 outputs a first message. The first message may indicate that the first electrode and the second electrode of the battery B are in non-faulty state.

In step S870, the processor 130 outputs a second message. The second message may indicate that at least one of the first electrode and the second electrode of the battery B is in faulty state.

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

DESCRIPTION OF REFERENCE NUMERALS

C: Electrical system
1: Battery pack
B: Battery
100: Apparatus
110: Sensing unit
120: Memory unit
130: Processor
140: Notifying unit

What is claimed is:

1. An apparatus for determining electrode information of a battery including a first electrode and a second electrode, the apparatus comprising:
one or more sensors configured to measure a voltage of the battery and a current of the battery; and
a processor operably coupled to the one or more sensors, wherein the processor is configured to:
determine a remaining capacity of the battery based on the measured current of the battery;
convert a Q-V curve indicating a relationship between the voltage of the battery and the remaining capacity of the battery into a V-dQ/dV curve indicating a relationship between the voltage of the battery and a ratio of an amount of change of the remaining capacity to an amount of change of the voltage of the battery;
detect a plurality of feature points from the V-dQ/dV curve;
classify each of the plurality of feature points as a first electrode feature point or a second electrode feature point;
determine a total number of the plurality of feature points classified as first electrode feature points and a total number of the plurality of feature points classified as second electrode feature points;
access, from memory operably coupled to the processor, prestored information associating types of electrode active materials with corresponding total numbers of features points; and
determine, according to the accessed prestored information, a type of a first electrode active material and a type of a second electrode active material included in the battery based on types of electrode active materials associated with the determined total number of the plurality of feature points classified as first electrode feature points and the determined total number of the plurality of feature points classified as second electrode feature points.

2. The apparatus according to claim 1, wherein the processor is configured to:
classify each feature point disposed in a voltage range equal to or more than a predetermined reference voltage as a first electrode feature point; and
classify each feature point disposed in a voltage range less than the reference voltage as a second electrode feature point.

3. The apparatus according to claim 1, wherein the processor is configured to:
obtain a first capacity-potential curve of a reference battery from the memory; and
for each first electrode feature point:
determine a first electrode potential of the reference battery corresponding to a remaining capacity of the first electrode feature point based on the first capacity-potential curve; and
determine a potential of the second electrode of the battery corresponding to the remaining capacity of the first electrode feature point based on a voltage of the first electrode feature point and the first electrode potential of the reference battery,
wherein the reference battery includes the first electrode active material and the second electrode active material.

4. The apparatus according to claim 3, wherein the processor is configured to determine the potential of the second electrode of the battery by subtracting the voltage of the first electrode feature point from the first electrode potential of the reference battery.

5. The apparatus according to claim 3, wherein the processor is configured to:
obtain a second capacity-potential curve of the reference battery from the memory unit; and
for each second electrode feature point:
determine a second electrode potential of the reference battery corresponding to a remaining capacity of the second electrode feature point from the second capacity-potential curve, and
determine a potential of the first electrode of the battery corresponding to the remaining capacity of the second electrode feature point based on a voltage of the second electrode feature point and the second electrode potential of the reference battery.

6. The apparatus according to claim 5, wherein the processor is configured to determine the potential of the first electrode of the battery by adding the voltage of the second electrode feature point to the second electrode potential of the reference battery.

7. The apparatus according to claim 5, wherein the processor is configured to determine whether the potential of the first electrode of the battery is valid based on a result of comparing the potential of the first electrode of the battery with a valid range.

8. The apparatus according to claim 7, wherein the processor is configured to output a message indicating that the first electrode of the battery is in faulty state when the potential of the first electrode of the battery is outside of a first valid range.

9. A battery pack comprising the apparatus according to claim 1.

10. An electrical system comprising the battery pack according to claim 9.

11. A method for determining electrode information of a battery, comprising:
measuring each of a voltage and a current of the battery;
determining a remaining capacity of the battery based on the measured current of the battery;
generating a Q-V curve indicating a relationship between the voltage of the battery and the remaining capacity of the battery;
converting the Q-V curve into a V-dQ/dV curve;
detecting the plurality of feature points from the V-dQ/dV curve indicating a relationship between the voltage of the battery and a ratio of an amount of change of the remaining capacity to an amount of change of the voltage of the battery;
detecting a plurality of feature points from the V-dQ/dV curve;
classifying each of the plurality of feature points as a first electrode feature point or as a second electrode feature point;
determining a total number of the plurality of feature points classified as first electrode feature points and a total number of the plurality of feature points classified as second electrode feature points;
accessing, from memory, prestored information associating types of electrode active materials with corresponding total numbers of features points; and
determining, according to the accessed prestored information, a type of a first electrode active material and a type of a second electrode active material included in the battery based on types of electrode active materials associated with the determined total number of the plurality of feature points classified as first electrode feature points and the determined total number of the plurality of feature points classified as second electrode feature points.

12. The method according to claim 11, further comprising:
obtaining a first capacity-potential curve and a second capacity-potential curve for a reference battery based on the type of the first electrode active material and the type of the second electrode active material;
for each first electrode feature point:
determining a first electrode potential of the reference battery corresponding to the remaining capacity of the first electrode feature point from the first capacity-potential curve; and
determining a potential of the second electrode of the battery corresponding to the remaining capacity of the first electrode feature point based on a voltage of the first electrode feature point and the first electrode potential of the reference battery.

13. The method according to claim 12, further comprising determining the potential of the second electrode of the battery by subtracting the voltage of the first electrode feature point from the first electrode potential of the reference battery.

14. The method according to claim 11, further comprising:
obtaining a second capacity-potential curve of the reference battery from the memory; and
for each second electrode feature point:
determining a second electrode potential of the reference battery corresponding to a remaining capacity of the second electrode feature point from the second capacity-potential curve, and
determining a potential of the first electrode of the battery corresponding to the remaining capacity of the second electrode feature point based on a voltage of the second electrode feature point and the second electrode potential of the reference battery.

15. The method according to claim 14, further comprising determining the potential of the first electrode of the battery by adding the voltage of the second electrode feature point to the second electrode potential of the reference battery.

16. The method according to claim 14, further comprising determining whether the potential of the first electrode of the battery is valid based on a result of comparing the potential of the first electrode of the battery with a first valid range.

17. The method according to claim 16, further comprising outputting a message indicating that at least one of the first electrode or the second electrode of the battery is in faulty state when the potential of the first electrode of the battery is outside of the first valid range or when the potential of the second electrode of the battery is outside of a second valid range.

18. The method according to claim 11, further comprising:
classifying each feature point disposed in a voltage range equal to or more than a predetermined reference voltage as a first electrode feature point; and
classifying each feature point disposed in a voltage range less than the predetermined reference voltage as a second electrode feature point.

* * * * *